(12) United States Patent
Kao et al.

(10) Patent No.: US 11,764,801 B2
(45) Date of Patent: Sep. 19, 2023

(54) COMPUTING-IN-MEMORY CIRCUIT

(71) Applicant: NOVATEK MICROELECTRONICS CORP., Hsinchu (TW)

(72) Inventors: Shiau-Wen Kao, Hsinchu (TW); Ying-Chung Chiu, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 280 days.

(21) Appl. No.: 17/356,552

(22) Filed: Jun. 24, 2021

(65) Prior Publication Data

US 2022/0416801 A1    Dec. 29, 2022

(51) Int. Cl.
| | | |
|---|---|---|
| H03M 1/12 | (2006.01) | |
| H03M 1/36 | (2006.01) | |
| G06F 7/544 | (2006.01) | |
| H03M 1/06 | (2006.01) | |
| H03M 1/80 | (2006.01) | |
| G06F 11/10 | (2006.01) | |
| G06F 7/20 | (2006.01) | |

(52) U.S. Cl.
CPC .......... *H03M 1/368* (2013.01); *G06F 7/5443* (2013.01); *H03M 1/069* (2013.01); *H03M 1/802* (2013.01); *G06F 7/20* (2013.01); *G06F 11/1068* (2013.01)

(58) Field of Classification Search
CPC ...... H03M 1/368; H03M 1/069; H03M 1/802; G06F 7/5443; G06F 7/20; G06F 3/0659; G06F 11/1068
See application file for complete search history.

(56) References Cited

U.S. PATENT DOCUMENTS

| | | |
|---|---|---|
| 10,381,071 B1 | 8/2019 | Si et al. |
| 10,636,481 B1 | 4/2020 | Chang et al. |
| | | (Continued) |

OTHER PUBLICATIONS

Shunsuke Okumura et al. "A Ternary Based Bit Scalable, 8.80 TOPS/W CNN accelerator with Many-core Processing-in-memory Architecture with 896K synapses/mm2." 2019 Symposium on VLSI Technology (2019): C248-C249.

(Continued)

*Primary Examiner* — Joseph J Lauture
(74) *Attorney, Agent, or Firm* — JCIPRNET

(57) ABSTRACT

A computing-in-memory circuit comprises a computing element array and an analog-to-digital conversion circuit. The computing element array is utilized for analog computation operations. The computing element array includes memory cells, a first group of computing elements, and a second group of computing elements. The first group of computing elements provides capacitance for analog computation in response to an input vector and receives data from the plurality of memory cells and the input vector. The second group of computing elements provides capacitance for quantization. Each computing element of the computing element array is based on a switched-capacitors circuit. The analog-to-digital conversion circuit includes a comparator and a conversion control unit. The comparator has a signal terminal, a reference terminal, and a comparison output terminal, wherein the first and second groups of computing elements are selectively coupled to the signal terminal and the reference terminal.

12 Claims, 14 Drawing Sheets

(56) References Cited

U.S. PATENT DOCUMENTS

2019/0103156 A1\* 4/2019 Sumbul ................ G11C 7/1006
2020/0174786 A1 6/2020 Zhang et al.

OTHER PUBLICATIONS

Avishek Biswas, et al., "Conv-RAM: An Energy-Efficient SRAM with Embedded Convolution Computation for Low-Power CNN-Based Machine Learning Applications," ISSCC 2018 / SESSION 31/ Computation in Memory for Machine Learning/ 31.1, 488-489.

\* cited by examiner

COMPUTING-IN-MEMORY CIRCUIT

BACKGROUND OF THE INVENTION

1. Field of the Invention

The present disclosure relates to deep learning acceleration techniques by way of hardware, and in particular to a computing-in-memory circuit.

2. Description of the Related Art

At present, in the structure of a deep learning accelerator using process-in-memory technology, the operation mode of the multiply-accumulate operation (MAC) unit can be categorized into current mode and charge mode. As the related literature, A. Biswas, et al.," Cony-RAM: An Energy-Efficient SRAM with Embedded Convolution Computation for Low-Power CNN-Based Machine Learning Applications" ISSCC, pp. 488-489, 2018, mentions that the threshold voltage of a transistor ($V_{TH}$) is susceptible to process/voltage/temperature (PVT) drift, etc., so the accuracy of the operation will decrease. Furthermore, the result of the analog operation should be converted back to a digital signal by an analog-to-digital converter, and then the subsequent digital signal processing can proceed in the digital domain. If the types and the generation manners for the analog-to-digital converter and the multiply-accumulate operation unit are inconsistent, the error generated will further reduce the accuracy of the operations.

Since the input of the multiply-accumulate operation unit is a finite-bit digital signal, that is, a signal that has been quantized, after the multiply-accumulate operation unit, the quantizer only needs to quantize the limited quantization level (analog). The challenge here is that the analog level can be regarded as the DC level. In general analog circuits, DC errors, drift and other issues will be the key to the correctness of the conversion. This is different from the general communication system, because the signals are mostly transmitted in the form of AC, and most of the performance metrics of analog-to-digital converters are defined in terms of AC response.

BRIEF SUMMARY OF THE INVENTION

An objective of the present disclosure is to provide an analog multiply-add operation unit, which is suitable for capacitive mode, and is a combination of multiply-add operation unit and quantizer, which can effectively reduce errors.

To achieve at least the above objective, the present disclosure provides a computing-in-memory circuit comprising: a computing element array and an analog-to-digital conversion circuit. The computing element array is utilized for analog computation operations. The computing element array includes a plurality of memory cells, a first group of computing elements, and a second group of computing elements. The first group of computing elements provides capacitance for analog computation in response to an input vector, wherein the first group of computing elements receives data from the plurality of memory cells and the input vector. The second group of computing elements provides capacitance for quantization, wherein each computing element of the computing element array is based on a switched-capacitors circuit. The analog-to-digital conversion circuit includes a comparator and a conversion control unit. The comparator has a signal terminal, a reference terminal, and a comparison output terminal, wherein the computing elements of the first group of computing elements are selectively coupled to the signal terminal and the reference terminal according to the input vector. The conversion control unit is coupled to the comparison output terminal and controls coupling of a first number of computing elements from the second group of computing elements to the signal terminal and the reference terminal according to an output of the comparison output terminal.

In some embodiments, the conversion control unit further controls coupling of a second number of computing elements from the second group of computing elements to the signal terminal according to the output of the comparison output terminal.

In some embodiments, the conversion control unit determines a final digital code of N-bits according to successive outputs of the comparison output terminal, wherein N is an integer greater than 1, the conversion control unit determines an updated version of the first number or the second number according to a previous output of the successive outputs of the comparison output terminal.

In some embodiments, the computing elements of the first group of computing elements selectively couple charged capacitance to the signal terminal and selectively couple discharged capacitance to reference terminal, according to the data received from the plurality of memory cells and input vector.

In some embodiments, the computing elements of the second group of computing elements selectively couple charged capacitance to the reference terminal and discharged capacitance to the signal terminal, according to at least one reference control signal from the conversion control circuit.

In some embodiments, the conversion control circuit determines the at least one reference control signal according to the output of the comparison output terminal.

In some embodiments, when a signal at the reference terminal is less than a signal at the signal terminal, the conversion control circuit generates the at least one reference control signal to control the computing elements of the second group of computing elements to selectively couple charged capacitance to the reference terminal and discharged capacitance to the signal terminal.

In some embodiments, the computing elements of the second group of computing elements further selectively couple additional charged capacitance to the signal terminal and additional discharged capacitance to the reference terminal, according to the at least one reference control signal.

In some embodiments, the conversion control circuit determines the at least one reference control signal according to the output of the comparison output terminal.

In some embodiments, when a signal at the reference terminal is greater than a signal at the signal terminal, the conversion control circuit generates the at least one reference control signal to control the computing elements of the second group of computing elements to selectively couple charged capacitance to the reference terminal, discharged capacitance to the signal terminal, additional charged capacitance to the signal terminal, and additional discharged capacitance to the reference terminal.

In some embodiments, the analog computation operations are multiplication-accumulation (MAC) operations.

In some embodiments, the computing-in-memory circuit is disposed in a single chip.

DETAILED DESCRIPTION OF THE INVENTION

To facilitate understanding of the object, characteristics and effects of this present disclosure, embodiments together with the attached drawings for the detailed description of the present disclosure are provided.

Figure 1:
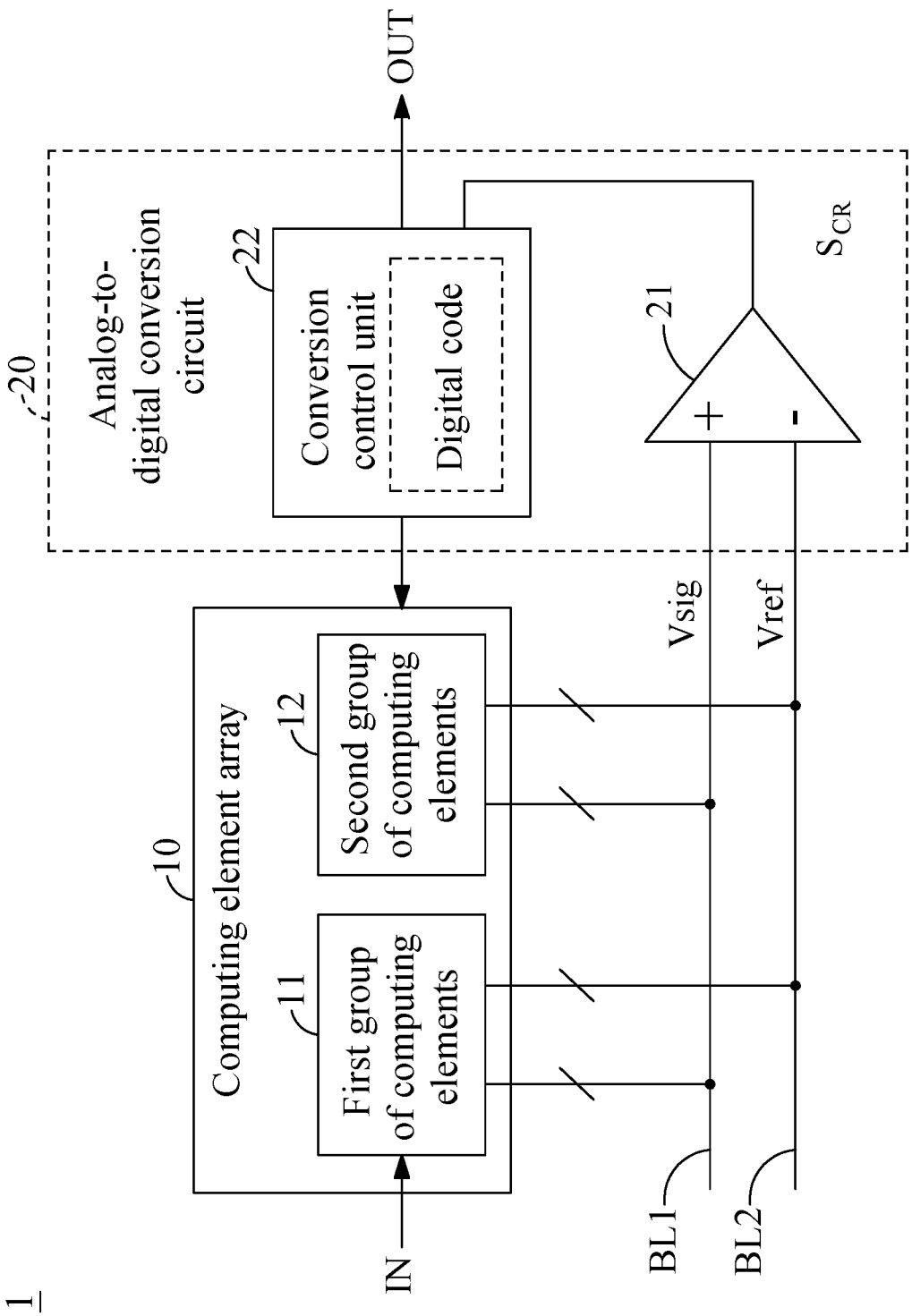
FIG. 1 is a block diagram illustrating architecture of a computing-in-memory circuit, representing various embodiments of the invention.

Referring to FIG. 1, architecture of a computing-in-memory circuit 1, representing various embodiments of the invention is illustrated in a block diagram. A computing-in-memory circuit 1 comprises a computing element array 10 and an analog-to-digital conversion circuit 20. For example, the computing-in-memory circuit 1 is disposed in a single chip.

The computing element array 10 is utilized for analog computation operations.

Figure 2:
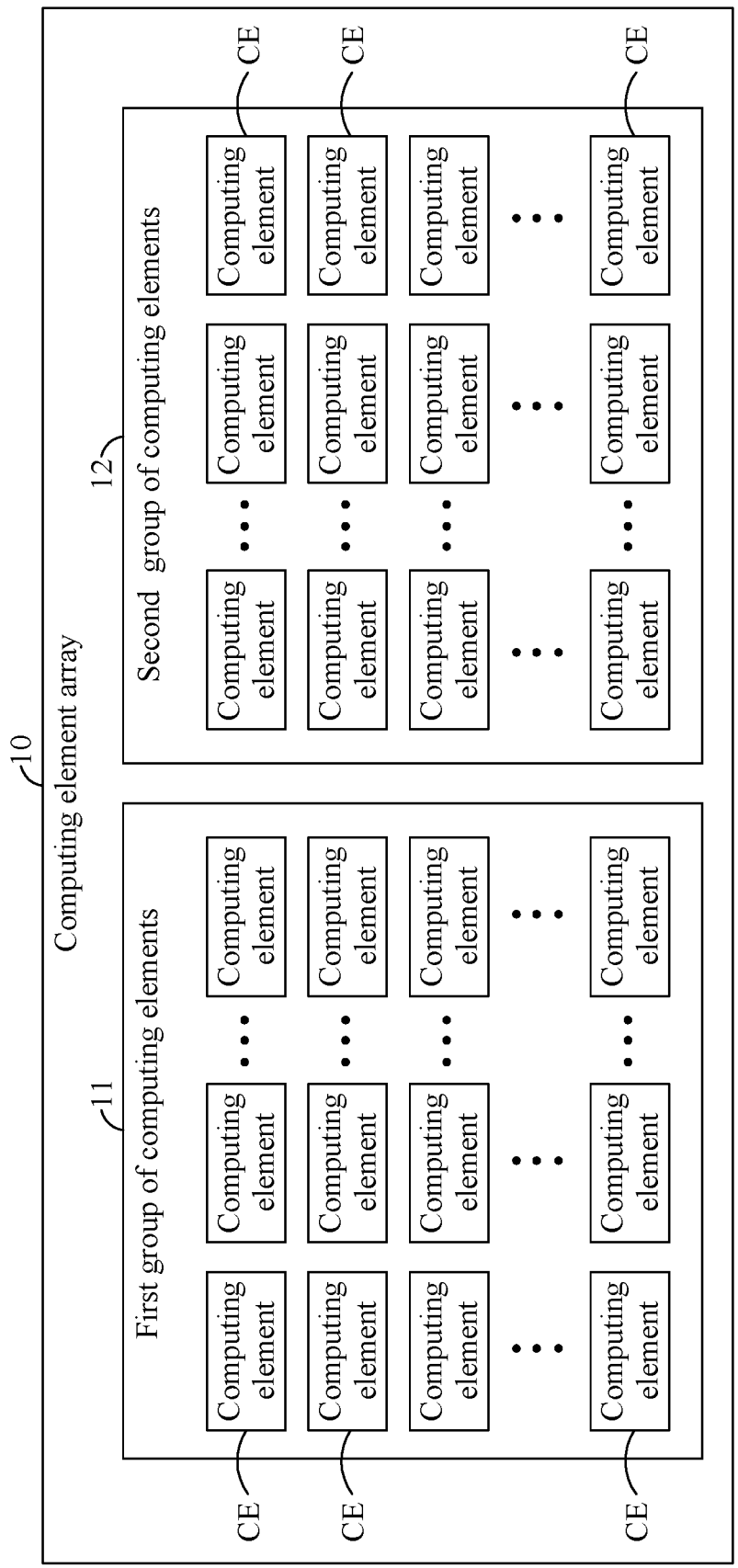
FIG. 2 is a schematic diagram illustrating an embodiment of a computing element array of FIG. 1.
Figures 3A, 3B:
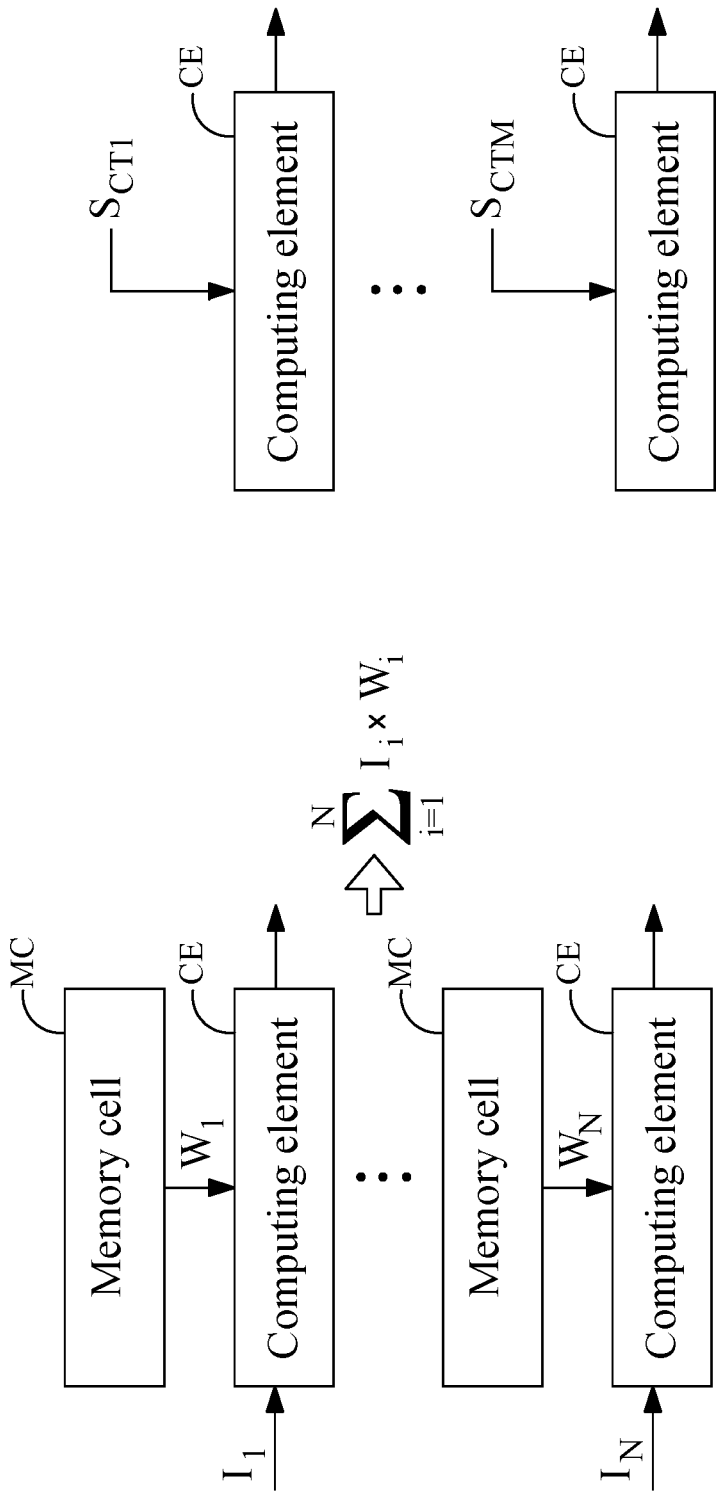
FIG. 3A is a block diagram illustrating an embodiment of a first group of computing elements according to the architecture of FIG. 1.
FIG. 3B is a block diagram illustrating an embodiment of a second group of computing elements according to the architecture of FIG. 1.

Referring to FIGS. 1, 2, 3A and 3B, the computing element array 10 includes a plurality of memory cells (MC), a first group of computing elements (or called first CE group) 11, and a second group of computing elements (or called second CE group) 12. Each group of the first group of computing elements 11 and the second group of computing elements 12 include a respective number of computing elements (CE), as illustrated in FIGS. 3A and 3B.

The first group of computing elements 11 provides capacitance for analog computation in response to an input vector (as indicated by "IN" in FIG. 1). The first group of computing elements 11 receives data from the plurality of memory cells and the input vector. For example, the input vector can be a scalar, array, matrix, or multi-dimensional vector in digital form and the first CE group 11 can be configured in a corresponding arrangement (e.g., in an array form as shown in FIG. 2) of computing elements (CE) for analog computation accordingly.

The second group of computing elements 12 provides capacitance for quantization, wherein each computing element of the computing element array 10 is based on a switched-capacitors circuit.

The analog-to-digital conversion circuit 20 includes a comparator 21 and a conversion control unit 22. The comparator 21 has a signal terminal (e.g., a positive or non-inverting terminal) for receiving an input signal Vsig (e.g., through a signal path BL1) for comparison, a reference terminal (e.g., a negative or inverting terminal) for receiving a reference signal Vref (e.g., through a signal path BL2), and a comparison output terminal for outputting a comparison output signal $S_{CR}$. The first group of computing elements 11 are selectively coupled to the signal terminal and the reference terminal according to the input vector. The conversion control unit 22 is coupled to the comparison output terminal and controls coupling of a first number of computing elements from the second group of computing elements 12 to the signal terminal and the reference terminal according to an output of the comparison output terminal.

The architecture of the computing-in-memory circuit 1 is based on a circuit combination of the computing element array 10 and the analog-to-digital conversion circuit 20 and operates in charge mode. Accordingly, the input signal Vsig for comparison and the reference signal Vref applied to the comparator 21 are obtained by way of the capacitances (charged or discharged selectively) provided by the first CE group 11 and the second CE group 12, respectively. The first CE group 11 and the second CE group 12 can be fabricated to have the similar type of circuits in a chip by using a same manufacturing process because each computing element (CE) of the computing element array 10 is based on a switched-capacitors circuit. Thus, the architecture of the computing-in-memory circuit 1 facilitates the reduction of relative errors effectively and reduction of inaccuracy caused by process/voltage/temperature (PVT) variations of the computing element array 10.

The following provides embodiments of the computing element array 10 and the analog-to-digital conversion circuit 20 and their operations in charge mode.

Referring to FIG. 3A, an embodiment of a first group of computing elements is illustrated according to the architecture of FIG. 1. For example, the input vector includes a plurality of input values (e.g., $I_1, \ldots, I_N$ (bit values)) in digital form. As illustrated in FIG. 3A, the plurality of input values (e.g., bit values $I_1 \ldots, I_N$, N>1) and a corresponding plurality of weight values (e.g., $W_1$, $W_N$ (bit values)) stored in a plurality of memory cells (MC) (e.g., static random access memory (SRAM) cells) are applied to the computing elements (CE) of the first CE group 11, respectively. Referring to FIG. 3A, in an embodiment of the first CE group 11, each computing element CE provides corresponding capacitance (charged or discharged) representing the product of the corresponding input and weight values. For example, the output of the computing elements (CE) can be accumulated to generate a summation of the products of the input values and the weight values in voltage or current format, wherein the summation can be represented by a formula:

$$\sum_{i=1}^{N} I_i * W_i.$$

In some embodiments, the input vector can include multiple-bits values; the input vector can be a two-dimensional vector, or a multi-dimensional vector; and the first CE group 11 accordingly can be implemented according to FIG. 3A or modification thereof whenever appropriate.

Referring to FIG. 3B, an embodiment of a second group of computing elements is illustrated according to the architecture of FIG. 1. As shown in FIG. 3B, the second group of computing elements 12 include a plurality of computing elements (CE). Each computing element (CE) provides corresponding capacitance (charged or discharged) for quantization and is controlled selectively according to at least one reference control signal (e.g., $S_{CT1}, \ldots,$ or $S_{CTM}$).

Figure 4A:
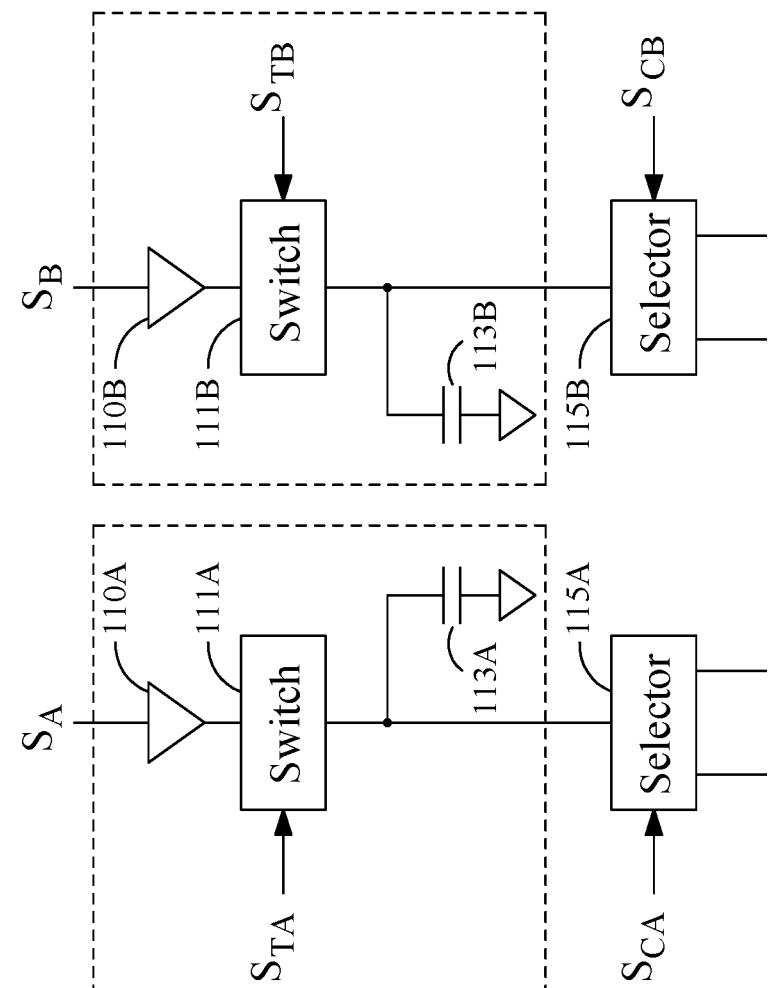
FIG. 4A is a schematic diagram illustrating an embodiment of a switched-capacitors circuit according to which a computing element can be constructed.

As mentioned above, each computing element of the computing element array 10 is based on a switched-capacitors circuit. Referring to FIG. 4A, an embodiment of a switched-capacitors circuit is illustrated, according to which a computing element can be constructed. As shown in FIG. 4A, a switched-capacitors circuit 100 includes buffers 110A-110B, switches 111A-111B, capacitors 113A-113B, and selectors 115A-115B. The buffer 110A (or 110B) receives a signal $S_A$ (or $S_B$). The switch 111A (or 111B) is controlled according to a control signal $S_{TA}$ (or $S_{TB}$). The capacitor 113A (or 113B) is coupled to the output of the switch 111A (or 111B). The selector 115A (or 115B) is coupled to the capacitor 113A (or 113B) and is controlled to generate an output to one of its two terminals according to a control signal $S_{CA}$ (or $S_{CB}$).

The capacitor 113A (or 113B) can be charged or discharged according to the signal $S_A$ (or $S_B$). When the signal $S_A$ (or $S_B$) indicates a logic high level and the control signal $S_{TA}$ (or $S_{TB}$) indicates the switch 111A (or 111B) to be on, the capacitor 113A (or 113B) is then to be charged to the logic high level. When the signal $S_A$ (or $S_B$) indicates a logic low level and the control signal $S_{TA}$ (or $S_{TB}$) indicates the switch 111A (or 111B) to be on, the capacitor 113A (or 113B) is then to be discharged to the logic high level.

After the capacitor 113A (or 113B) is fully charged or discharged, the control signal $S_{TA}$ (or $S_{TB}$) can be set to indicate the switch 111A (or 111B) to be off. Afterwards, the control signal $S_{CA}$ (or $S_{CB}$) can be set to indicate to select one of the terminals of the selector 115A (or 115B) to provide charged or discharged capacitance to the selected one of the terminals of the selector 115A (or 115B). In an example, the control signal $S_{CA}$ (or $S_{CB}$) can be set to indicate the selector 115A (or 115B) to be off and not to provide the charged or discharged capacitance. For example, the selector 115A or 115B can be implemented using two switches with one or two control signals.

For the sake of brevity, the process of charging or discharging capacitance with the control signal $S_{TA}$ (or $S_{TB}$) will not be detailed in the following embodiments and the drawing of the switched-capacitors circuit may be shown in a simplified form.

Figure 4B:
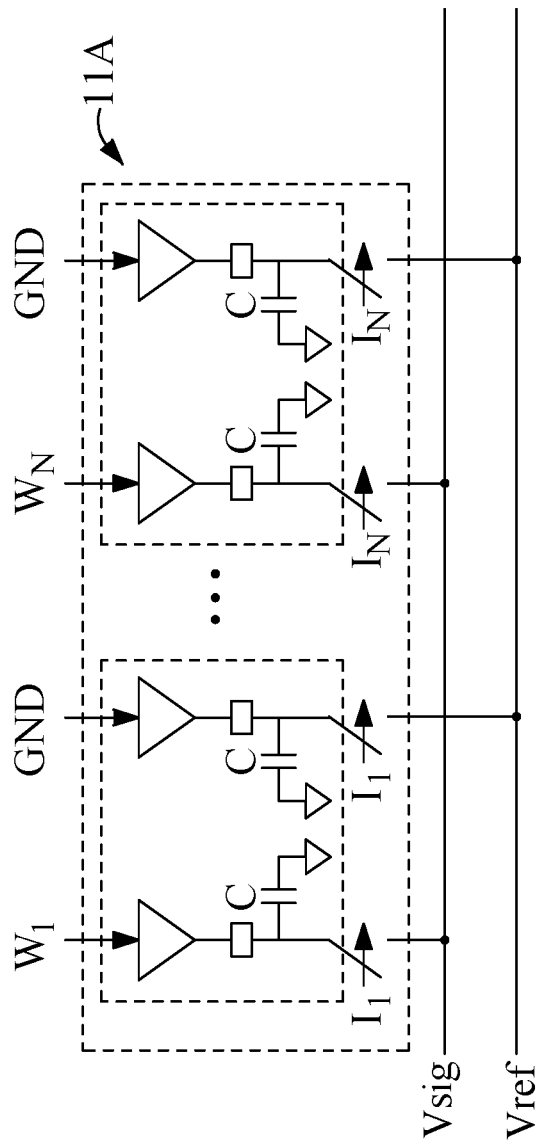
FIG. 4B is a schematic diagram illustrating an embodiment of a first group of computing elements according to the switched-capacitors circuit.

Referring to FIG. 4B, an embodiment of a first group of computing elements is illustrated according to the switched-capacitors circuit. As shown in FIG. 4B, a first group of computing elements 11A is an implementation of the first group of computing elements of FIG. 3A according to the switched-capacitors circuit 100 as exemplified in FIG. 4A. In FIG. 4B, each computing element is implemented according to the switched-capacitors circuit 100, wherein the signal $S_A$ is a weight value (e.g., $W_1, \ldots$ or $W_N$), the signal $S_B$ is a ground signal (GND), the control signals $S_{CA}$ and $S_{CB}$ are an input value (e.g., $I_1, \ldots$ or $I_N$). In FIG. 4B, the selector 115A (or 115B) of the switched-capacitors circuit 100 is shown with a switch instead, wherein the switch can be the result of implementing the selector as two switches with one of the switches being made open circuit.

For example, in a computing element illustrated in FIG. 4B, when the weight value (e.g., $W_1, \ldots$ or $W_N$) indicates the logic high level, the corresponding capacitance is charged while the another capacitance is discharged. When the input value (e.g., $I_1, \ldots$ or $I_N$) indicates the switch to be on, the charged capacitance is then provided to the signal path for the input signal Vsig while the discharged capacitance is provided to the signal path for the reference signal Vref. In another example, the weight value (e.g., $W_1$) may indicate the logic low level, the operations are similar except that the corresponding capacitance will be discharged.

Figure 4C:
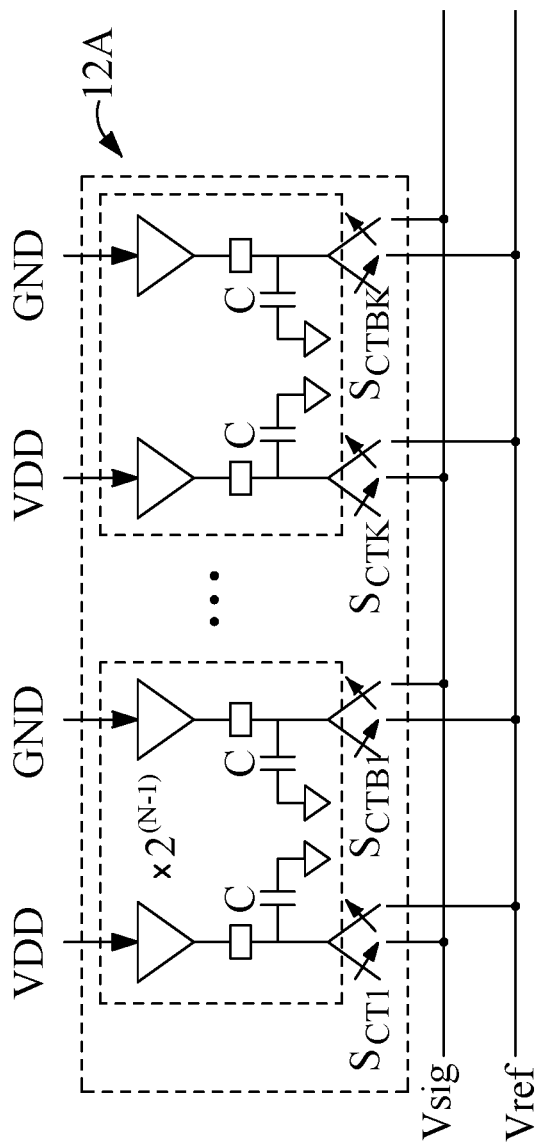
FIG. 4C is a schematic diagram illustrating an embodiment of a second group of computing elements according to the switched-capacitors circuit.

Referring to FIG. 4C, an embodiment of a second group of computing elements is illustrated according to the switched-capacitors circuit. As shown in FIG. 4C, a second group of computing elements 12A is an implementation of the second group of computing elements of FIG. 3B according to the switched-capacitors circuit 100 as exemplified in FIG. 4A. In FIG. 4C, each computing element is implemented according to the switched-capacitors circuit 100, wherein the signal $S_A$ is a logic high level signal (e.g., a power supply voltage, VDD), the signal $S_B$ is a ground signal (GND), the control signal $S_{CA}$ and $S_{CB}$ are regarded as reference control signals (e.g., $S_{CT1}, \ldots$ or $S_{CKT}$) and an inverse of the corresponding reference control signals (e.g., $S_{CTB1}, \ldots$ or $S_{CTBK}$). In FIG. 4C, the selector 115A (or 115B) of the switched-capacitors circuit 100 is shown with two switches, wherein the two switches can be controlled to be both off, or one to be on and another to be off.

For example, in a computing element illustrated in FIG. 4C, when a capacitance is charged while the another capacitance is discharged. When the reference control signal (e.g., $S_{CT1}, \ldots$ or $S_{CTBK}$) indicates one of the switches (corresponding to a selector) to be on for the signal path for the input signal Vsig, the charged capacitance is then provided to the signal path for the input signal Vsig while the discharged capacitance is provided to the signal path for the reference signal Vref. Conversely, when the reference control signal (e.g., $S_{CT1}$, or $S_{CTK}$) indicates one of the switches (corresponding to a selector) to be on for the signal path for the reference signal Vref, the charged capacitance is then provided to the signal path for the reference signal Vref while the discharged capacitance is provided to the signal path for the input signal Vsig.

Figure 5:
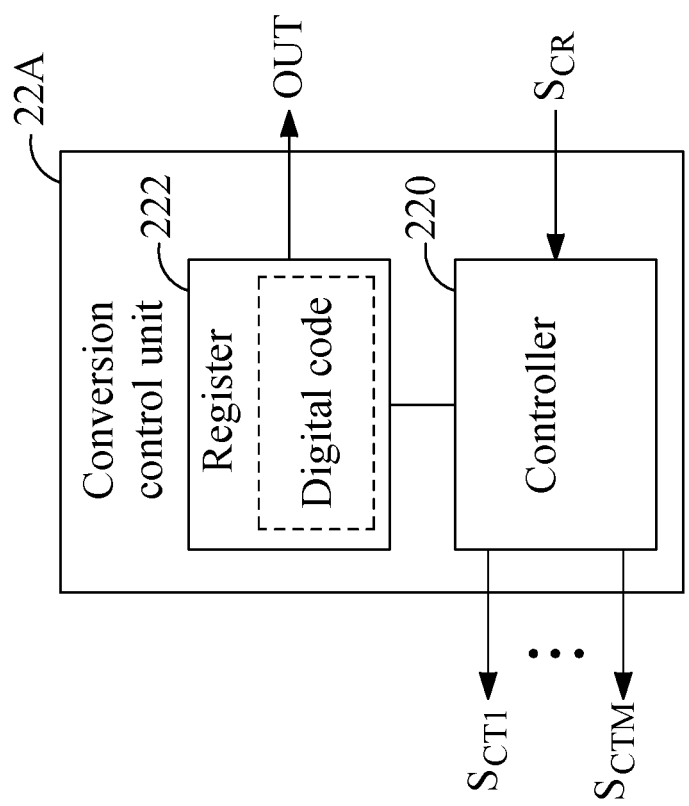
FIG. 5 is a schematic diagram illustrating an embodiment of a conversion control unit.

Referring to FIG. 5, an embodiment of a conversion control unit is illustrated. As shown in FIG. 5, a conversion control unit 22A includes a controller 220 and a register 222. The controller 220 can be a control logic circuit or a microcontroller-based circuit, or dedicated hardware circuit, to control the progress of analog-to-digital conversion (or quantization). The controller 220 generates a plurality of reference control signals (e.g., $S_{CT1}, \ldots, S_{CTM}$) in response to the comparison output signal $S_{CR}$. The register 222 is used to store data for the conversion, such as an approximate digital code and the final digital code, which is the result (indicated by "OUT") of the analog computation of the computing-in-memory in digital form.

Figure 6:
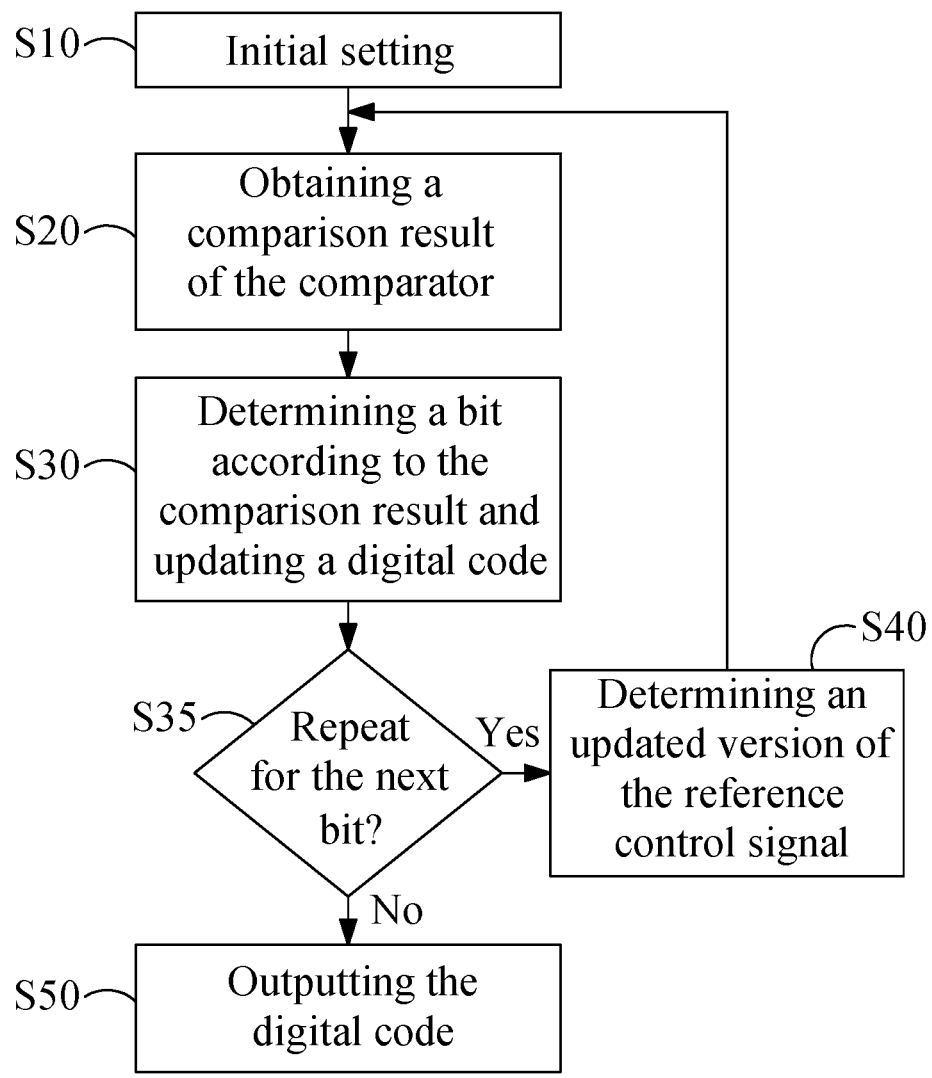
FIG. 6 is a flowchart illustrating a method to operate the analog-to-digital conversion circuit of FIG. 1 according to an embodiment.

Referring to FIG. 6, a method to operate the analog-to-digital conversion circuit of FIG. 1 is illustrating according to an embodiment. The method is a variant version of successive approximation register analog-to-digital conversion (SAR-ADC). For the sake of illustration, the analog-to-digital conversion circuit (e.g., 20) in FIG. 1 will be mentioned but the method is not limited thereto.

At step S10, initial setting is performed in the analog-to-digital conversion circuit (e.g., 20). For example, an initial version of at least one reference control signal is set. For example, for an N-bit analog-to-digital conversion, the initial version of the at least one reference control signal is set for the most significant bit, i.e., the (N−1)th bit, for the first clock phase of the analog-to-digital conversion, like the SAR-ADC does, wherein at least N clock phases are needed for completion of the analog-to-digital conversion.

At step S20, a comparison result (e.g., $S_{CR}$) of the comparator 21 is obtained by the conversion control unit 22.

At step S30, a bit according to the comparison result is determined by the conversion control unit 22 (e.g., control 220) and a digital code is updated.

At step S35, the conversion control unit 22 (e.g., control 220) determines whether to repeat for the next bit. If so, step S40 is performed; otherwise, step S50 is performed. For example, if the conversion for the (N−1)th bit is completed at step S30, the conversion process is repeated for the next bit, i.e., the (N−2)th bit until the conversion process for the zeroth bit is done.

At step S40, the conversion control unit 22 (e.g., control 220) determines an updated version of the at least one reference control signal.

At step S50, the conversion control unit 22 (e.g., control 220) outputs the digital code as the final digital code, which is the result (indicated by "OUT") of the analog computation of the computing-in-memory in digital form.

Figure 7:
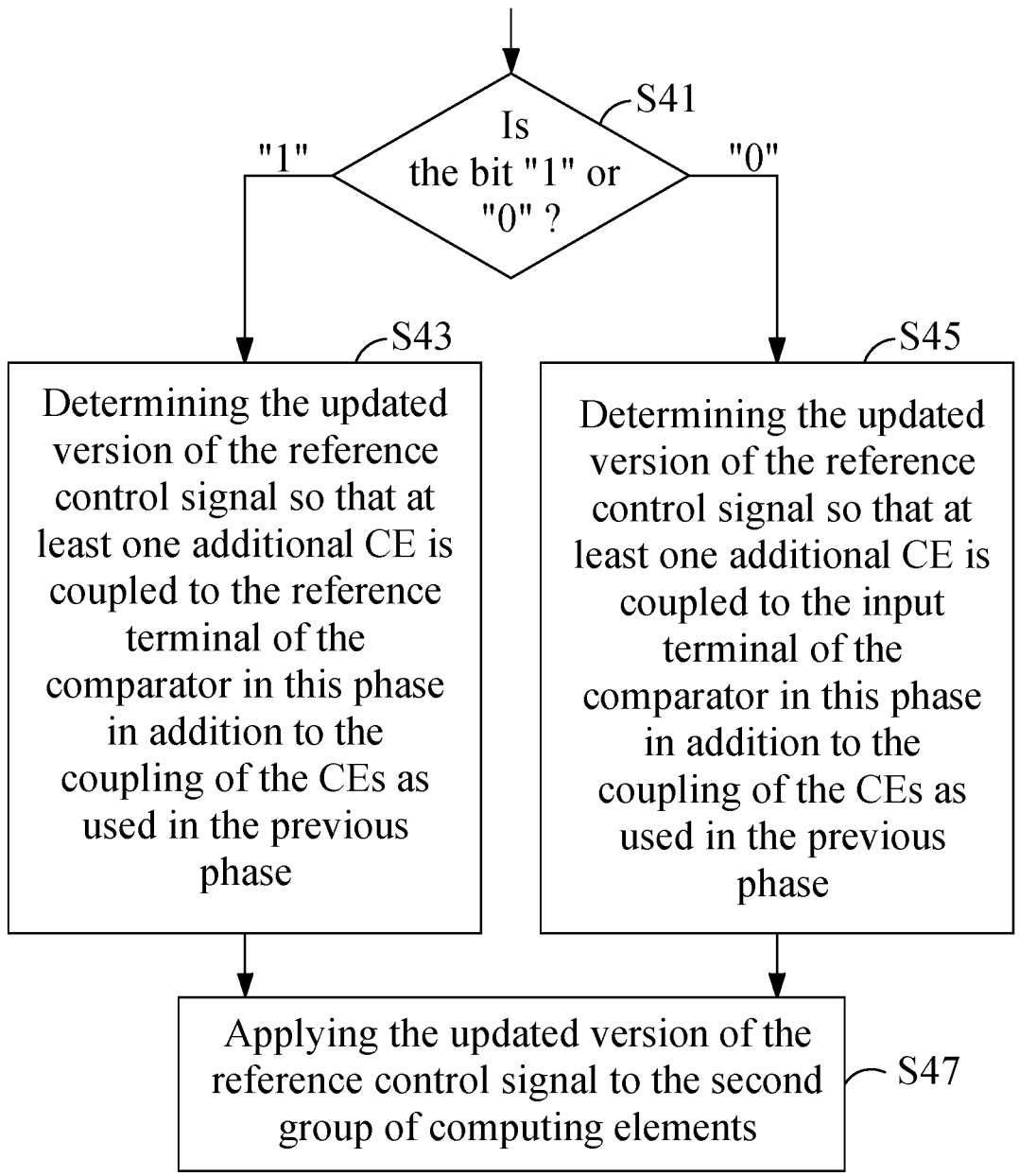
FIG. 7 is a flowchart illustrating an embodiment of step S40 of FIG. 6.

Referring to FIG. 7, an embodiment of step S40 of FIG. 6 is illustrated in flowchart form.

At step S41, the conversion control unit 22 (e.g., control 220) determines whether the bit determined at step S30 is "1" or "0". If the bit is "1", the method proceeds with step S43. If the bit is "0", the method proceeds with step S45.

At step S43, the conversion control unit 22 (e.g., control 220) determines the updated version of the at least one reference control signal so that at least one additional CE is coupled to the reference terminal in this phase in addition to the coupling of the CEs as used in the previous phase.

At step S45, the conversion control unit 22 (e.g., control 220) determines the updated version of the at least one reference control signal so that at least one additional CE is coupled to the input terminal in this phase in addition to the coupling of the CEs as used in the previous phase.

At step S47, the conversion control unit 22 (e.g., control 220) applies the updated version of the at least one reference control signal to the second group of computing elements.

In the above embodiment, steps S41-S47 can lead to a technical advantage that reset of the capacitance is not required, as will be illustrated later. The conversion control circuit (e.g., 22 or 22A) can be implemented according to the embodiment of FIG. 7 to reduce the need for reset of the capacitance during the process of the analog-to-digital conversion. Accordingly, the following embodiments are provided.

In some embodiments, the conversion control unit 22 further controls coupling of a second number of computing elements from the second group of computing elements 12 to the signal terminal according to the output of the comparison output terminal.

In some embodiments, the conversion control unit 22 determines a final digital code of N-bits according to successive outputs of the comparison output terminal, wherein N is an integer greater than 1, the conversion control unit 22 determines an updated version of the first number or the second number according to a previous output of the successive outputs of the comparison output terminal.

In some embodiments, the computing elements of the first group of computing elements 11 selectively couple charged capacitance to the signal terminal and selectively couple discharged capacitance to the reference terminal, according to the data received from the plurality of memory cells and input vector.

In some embodiments, the computing elements of the second group of computing elements 12 selectively couple charged capacitance to the reference terminal and discharged capacitance to the signal terminal, according to at least one reference control signal from the conversion control circuit.

In some embodiments, the conversion control circuit determines the at least one reference control signal according to the output of the comparison output terminal.

In some embodiments, when a signal at the reference terminal is less than a signal at the signal terminal, the conversion control circuit generates the at least one reference control signal to control the computing elements of the second group of computing elements 12 to selectively couple charged capacitance to the reference terminal and discharged capacitance to the signal terminal.

In some embodiments, the computing elements of the second group of computing elements 12 further selectively couple additional charged capacitance to the signal terminal and additional discharged capacitance to the reference terminal, according to the at least one reference control signal.

In some embodiments, the conversion control circuit determines the at least one reference control signal according to the output of the comparison output terminal.

In some embodiments, when a signal at the reference terminal is greater than a signal at the signal terminal, the conversion control circuit generates the at least one reference control signal to control the computing elements of the second group of computing elements 12 to selectively couple charged capacitance to the reference terminal, discharged capacitance to the signal terminal, additional charged capacitance to the signal terminal, and additional discharged capacitance to the reference terminal.

Referring to FIGS. 8-12, which are schematic diagrams illustrating embodiments to control coupling of a number of computing elements from a first group of computing elements and a second group of computing elements to a signal path to a signal terminal and a signal path to a reference terminal of a conversion control unit, according to the methods of FIGS. 6 and 7. For sake of illustration, a computing-in-memory circuit according to FIG. 1 is demonstrated wherein the first CE group 11A and the second CE group 12A as shown in FIGS. 4B and 4C are taken and the analog computation operations are multiplication-accumulation (MAC) operations. For the sake of brevity, FIGS. 8-12 partially show the computing-in-memory circuit according to FIG. 1 with respect to the first CE group 11A and the second CE group 12A and the two signal paths for comparison.

In addition, it is supposed that the input vector has 5 input values ($I_1, \ldots, I_5$) the conversion control unit 22 (e.g., control 220) performs 5 bit analog-to-digital conversion. Accordingly, 5 clock phases are required for the analog-to-digital conversion. Certainly, the implementation of the invention is not limited to the examples.

In the CE first group 11A, the control signals are formed according to the input vector for purpose of analog computation. Due to charge sharing, a computing element provides equal capacitance for both the signal path for the input signal Vsig and the signal path for the reference signal Vref is required, as will be illustrated in followed phases illustrated by FIGS. 8-12.

Figure 8:
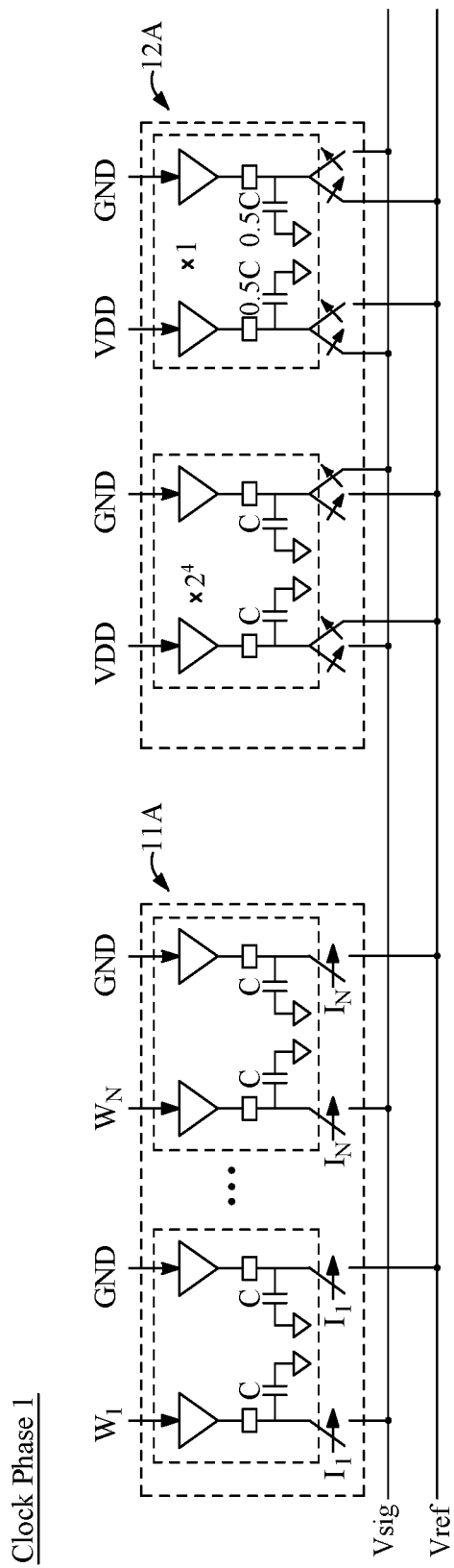
FIG. 8 is a schematic diagram illustrating an embodiment to control coupling of a number of computing elements from a first group of computing elements and a second group of computing elements to a signal path to a signal terminal and a signal path to a reference terminal of a conversion control unit.

Referring to FIG. 8, if $I_1$ to $I_5$ are the logic high level (or "H") and $W_1$ to $W_3$ are also "H" and $W_4$ to $W_5$ are "L," that is, equivalent MAC value is 3. In the circuit, Vsig=3CV/5 C and Vref=0 CV/5 C, where "C" represents a unit amount of capacitance.

Referring to FIG. 8, in clock phase 1, 16 ($=2^4$) CE of the second CE group 12A are selected to provide an amount of 16 C charged capacitance to the signal path for the reference signal Vref and an amount of 16 C discharged capacitance to the signal path for the input signal Vsig. In order to make the difference between the input signal Vsig and the reference signal Vref more significantly, one CE of the second CE group 12A is additionally selected to provide an amount of 0.5 C charged capacitance to the signal path for the input signal Vsig and an amount of 0.5 C discharged capacitance to the signal path for the reference signal Vref. In this case, Vsig=3CV/(5+16.5)C and Vref=16CV/(5+16.5)C, wherein the denominators of the formula of Vsig and Vref keep the same for both signal paths. Because the reference signal Vref is greater than the input signal Vsig, the bit according to step S30 is "0" and (N−1)th bit (e.g., fourth bit) of the digital code is set to "0" (indicated by $D_4$). According to steps S35, S41 and S45, in the next phase, additional CEs (e.g., 8 ($=2^3$) CEs) are going to be coupled to the signal path for the input signal Vsig. In other words, in the clock phase 2, additional charged capacitance is going to be added for the input signal Vsig while additional discharged capacitance is going to be added for the reference signal Vref.

Figure 9:
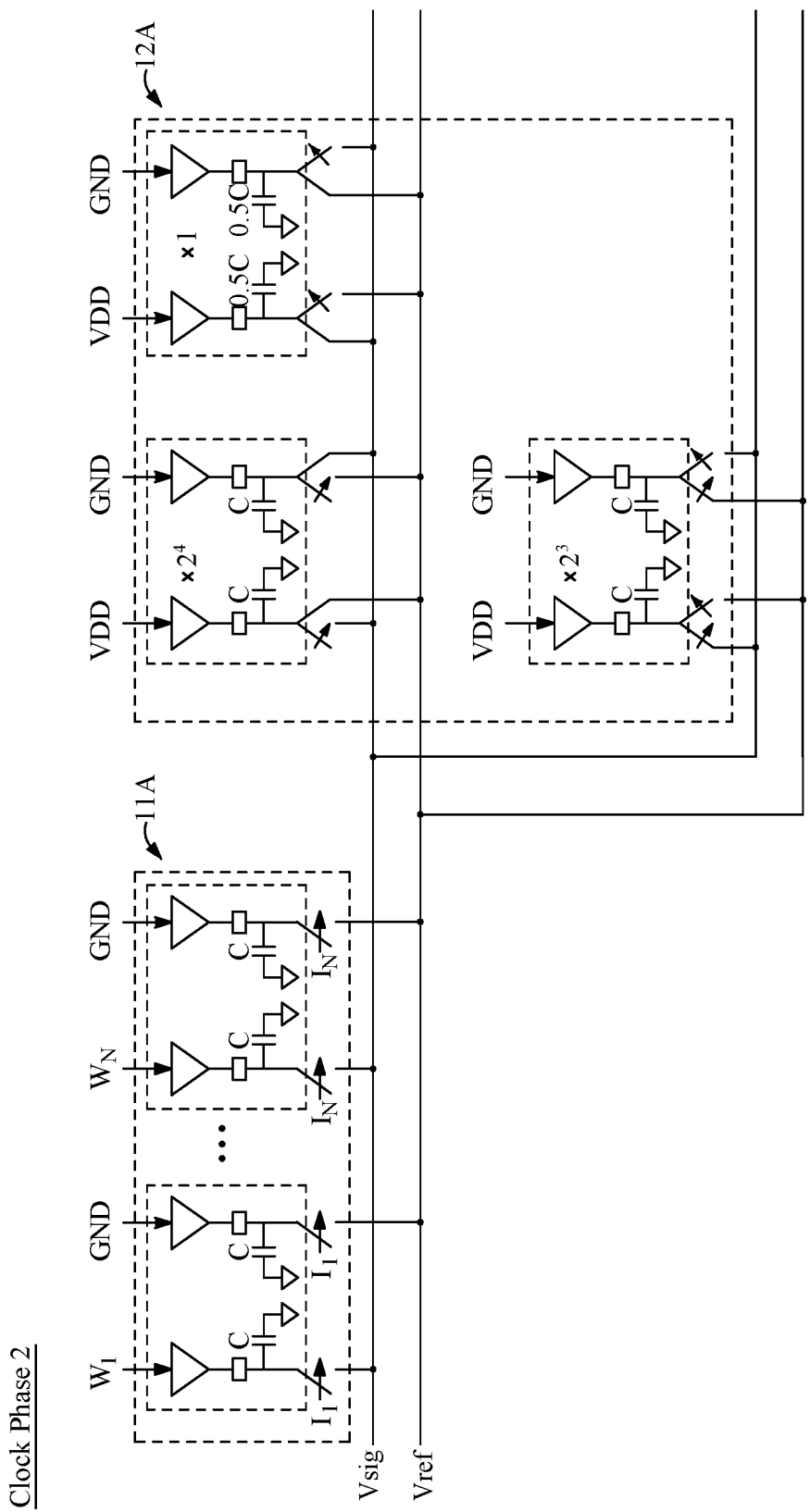
FIG. 9 is a schematic diagram illustrating an embodiment to control coupling of a number of computing elements from a first group of computing elements and a second group of computing elements to a signal path to a signal terminal and a signal path to a reference terminal of a conversion control unit.

Referring to FIG. 9, in clock phase 2, Vsig=(3+8)CV/(5+16.5+8)C and Vref=16CV/(5+16.5+8)C, wherein the denominators of the formula of Vsig and Vref keep the same for both signal paths. Because the reference signal Vref is greater than the input signal Vsig, the bit according to step S30 is "0" and (N−2)th bit (i.e., third bit) of the digital code is set to 0 (indicated by $D_3$). According to steps S35, S41 and S45, in the next phase, additional CEs (e.g., 4 ($=2^2$) CEs) are going to be coupled to the signal path for the input signal Vsig. In other words, additional charged capacitance is added for the input signal Vsig while additional discharged capacitance is going to be added for the reference signal Vref.

Figure 10:
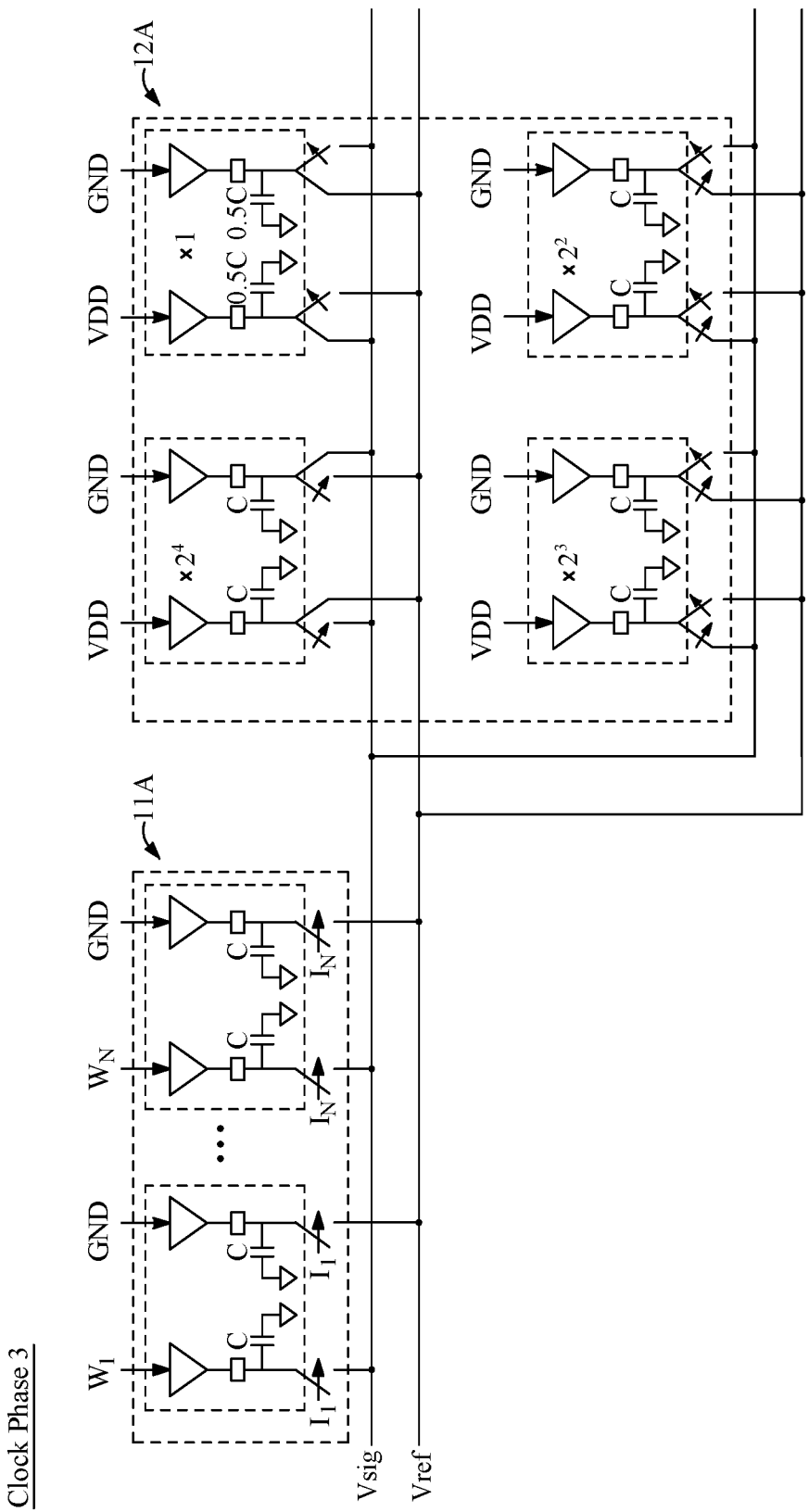
FIG. 10 is a schematic diagram illustrating an embodiment to control coupling of a number of computing elements from a first group of computing elements and a second group of computing elements to a signal path to a signal terminal and a signal path to a reference terminal of a conversion control unit.

Referring to FIG. 10, in clock phase 3, Vsig (3+0.5+8+4)CV/(5+16.5+8+4)C and Vref=16CV/(5+16.5+8+4)C, wherein the denominators of the formula of Vsig and Vref keep the same for both signal paths. Because the reference signal Vref is greater than the input signal Vsig, the bit according to step S30 is "0" and (N−3)th bit (e.g., second bit) of the digital code is set to "0" (indicated by $D_2$).

According to steps S35, S41 and S45, in the next phase, additional CEs (e.g., 2 ($=2^1$) CEs) are going to be coupled to the signal path for the input signal Vsig. In other words, in the clock phase 4, additional charged capacitance is going to be added for the input signal Vsig while additional discharged capacitance is going to be added for the reference signal Vref.

Figure 11:
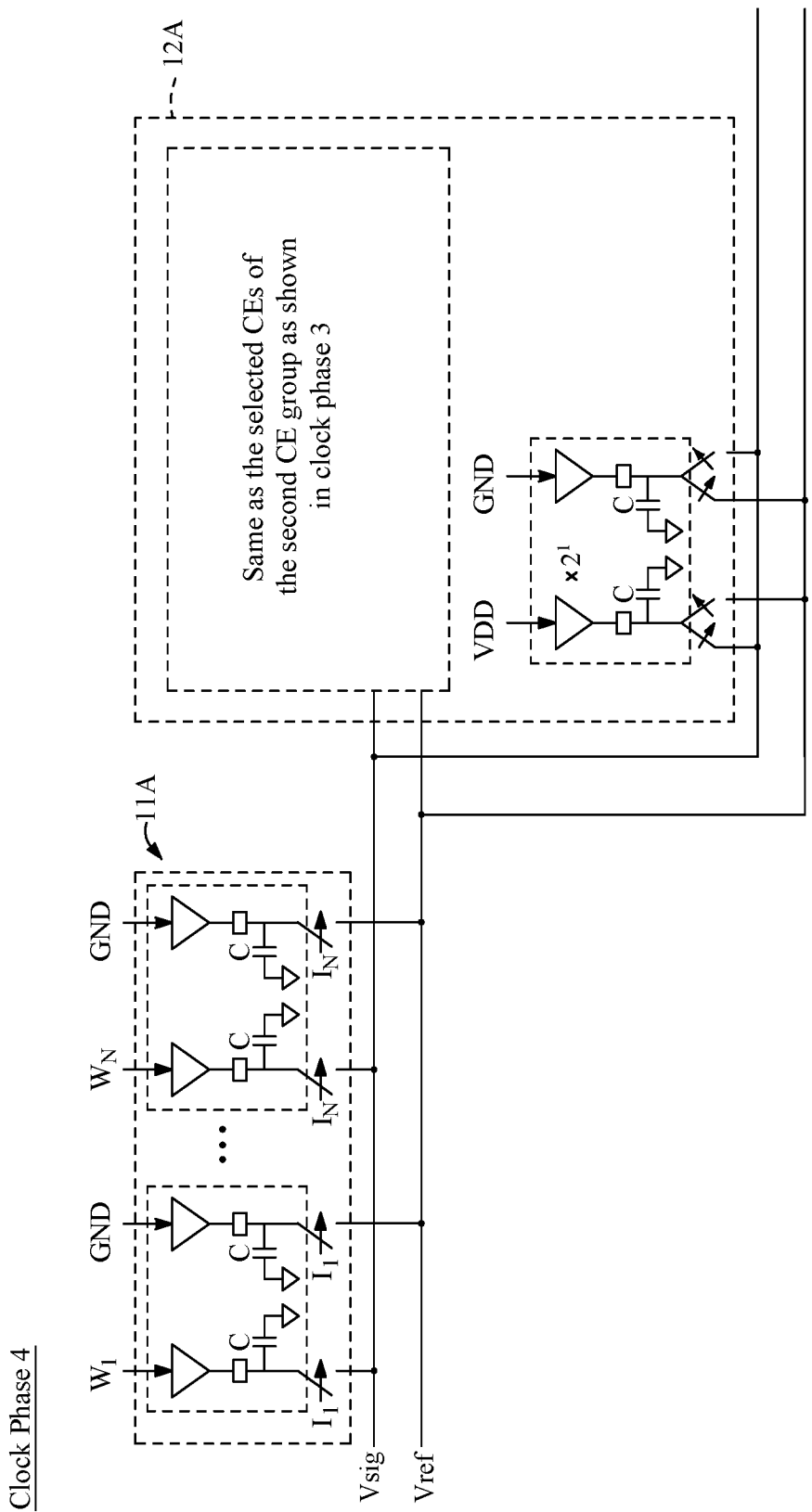
FIG. 11 is a schematic diagram illustrating an embodiment to control coupling of a number of computing elements from a first group of computing elements and a second group of computing elements to a signal path to a signal terminal and a signal path to a reference terminal of a conversion control unit.

Referring to FIG. 11, in clock phase 4, Vsig (3+0.5+8+4+2)CV/(5+16.5+8+4+2)C and Vref=16CV/(5+16.5+8+4+2)C, wherein the denominators of the formula of Vsig and Vref keep the same for both signal paths. Because the reference signal Vref is less than the input signal Vsig, the bit according to step S30 is "1" and (N−4)th bit (e.g., first bit) of the digital code is set to "1" (indicated by $D_1$). According to steps S35, S41 and S43, in the next phase, 1 ($=2^0$ additional CE is going to be coupled to the signal path for the reference signal Vref. In other words, in the clock phase 5, additional charged capacitance is going to be added for the reference signal Vref while additional discharged capacitance is going to be added for the input signal Vsig.

Figure 12:
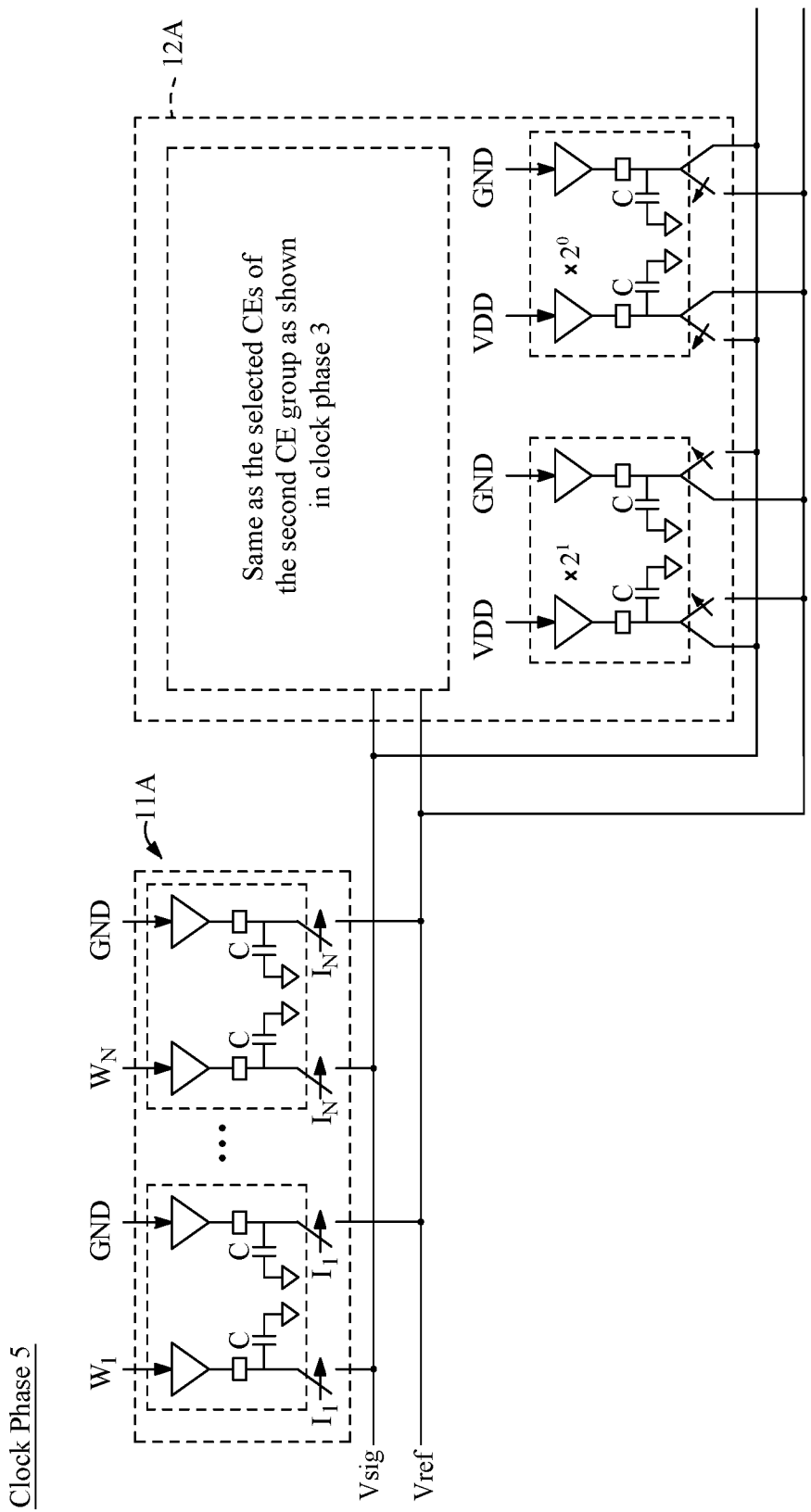
FIG. 12 is a schematic diagram illustrating an embodiment to control coupling of a number of computing elements from a first group of computing elements and a second group of computing elements to a signal path to a signal terminal and a signal path to a reference terminal of a conversion control unit.

Referring to FIG. 12, in clock phase 5, Vsig (3+0.5+8+4+2)CV/(5+16.5+8+4+2+1)C and Vref=(16+1)CV/(5+16.5+8+4+2+1)C, wherein the denominators of the formula of Vsig and Vref keep the same for both signal paths. Because the reference signal Vref is less than the input signal Vsig, the bit according to step S30 is "1" and (N−5)th bit (e.g., zeroth bit) of the digital code is set to 1 (indicated by $D_0$).

Accordingly, the final digital code $(D_4D_3D_2D_1D_0)=(00011)_2=3$.

It is noted that in the above embodiments of the process of the analog-to-digital conversion, when the reference signal Vref is greater than the input signal Vsig in one clock phase, one or more additional CEs from the second CE group 12A are set to be coupled to the signal path for the input signal Vsig in the next phase according to steps S41 and S45 of FIG. 7. In this manner, reset of the charged capacitance, as conventional SAR-ADC does, is not required. The conversion control circuit (e.g., 22 or 22A) can be implemented according to the embodiment of FIG. 7 to reduce or avoid the need for reset of the capacitance during the process of the analog-to-digital conversion. Accordingly, the analog-to-digital conversion can be performed more efficiently.

As such, the above provides various embodiment of a computing-in-memory circuit for charge mode. The sources of the reference voltage and the signal voltage are from groups of computing elements having the same architecture, which effectively reduces the relative error and can reduce or avoid the inaccuracy caused by process/voltage/temperature (PVT) drift. In addition, the architecture of the computing-in-memory circuit facilitates efficiency in the process of the analog-to-digital conversion so that the need for reset of the capacitance is reduced or avoided.

While the present disclosure has been described by means of specific embodiments, numerous modifications and variations could be made thereto by those skilled in the art without departing from the scope and spirit of the present disclosure set forth in the claims.

What is claimed is:

1. A computing-in-memory circuit comprising:
    a computing element array for analog computation operations, the computing element array including:
        a plurality of memory cells;
        a first group of computing elements to provide capacitance for analog computation in response to an input vector, wherein the first group of computing elements receives data from the plurality of memory cells and the input vector, and a second group of computing elements to provide capacitance for quantization, wherein each computing element of the computing element array is based on a switched-capacitors circuit; and an analog-to-digital conversion circuit, the analog-to-digital conversion circuit including:

a comparator having a signal terminal, a reference terminal, and a comparison output terminal, wherein the computing elements of the first group of computing elements are selectively coupled to the signal terminal and the reference terminal according to the input vector, and a conversion control unit coupled to the comparison output terminal to control coupling of a first number of computing elements from the second group of computing elements to the signal terminal and the reference terminal according to an output of the comparison output terminal.

2. The computing-in-memory circuit according to claim 1, wherein the conversion control unit further controls coupling of a second number of computing elements from the second group of computing elements to the signal terminal according to the output of the comparison output terminal.

3. The computing-in-memory circuit according to claim 2, wherein the conversion control unit determines a final digital code of N-bits according to successive outputs of the comparison output terminal, wherein N is an integer greater than 1, the conversion control unit determines an updated version of the first number or the second number according to a previous output of the successive outputs of the comparison output terminal.

4. The computing-in-memory circuit according to claim 1, wherein the computing elements of the first group of computing elements selectively couple charged capacitance to the signal terminal and selectively couple discharged capacitance to the reference terminal, according to the data received from the plurality of memory cells and input vector.

5. The computing-in-memory circuit according to claim 1, wherein the computing elements of the second group of computing elements selectively couple charged capacitance to the reference terminal and discharged capacitance to the signal terminal, according to at least one reference control signal from the conversion control circuit.

6. The computing-in-memory circuit according to claim 5, wherein the conversion control circuit determines the at least one reference control signal according to the output of the comparison output terminal.

7. The computing-in-memory circuit according to claim 5, wherein when a signal at the reference terminal is less than a signal at the signal terminal, the conversion control circuit generates the at least one reference control signal to control the computing elements of the second group of computing elements to selectively couple charged capacitance to the reference terminal and discharged capacitance to the signal terminal.

8. The computing-in-memory circuit according to claim 5, wherein the computing elements of the second group of computing elements further selectively couple additional charged capacitance to the signal terminal and additional discharged capacitance to the reference terminal, according to the reference control signal.

9. The computing-in-memory circuit according to claim 8, wherein the conversion control circuit determines the at least one reference control signal according to the output of the comparison output terminal.

10. The computing-in-memory circuit according to claim 8, wherein when a signal at the reference terminal is greater than a signal at the signal terminal, the conversion control circuit generates the at least one reference control signal to control the computing elements of the second group of computing elements to selectively couple charged capacitance to the reference terminal, discharged capacitance to the signal terminal, additional charged capacitance to the signal terminal, and additional discharged capacitance to the reference terminal.

11. The computing-in-memory circuit according to claim 1, wherein the analog computation operations are multiplication-accumulation (MAC) operations.

12. The computing-in-memory circuit according to claim 1, wherein the computing-in-memory circuit is disposed in a single chip.

* * * * *